United States Patent
Kim et al.

(10) Patent No.: US 8,339,193 B2
(45) Date of Patent: Dec. 25, 2012

(54) DEMODULATOR FOR SIMULTANEOUS MULTI-NODE RECEIVING AND THE METHOD THEREOF

(75) Inventors: Sun-hee Kim, Seoul (KR); Yun-jae Won, Gyeonggi-do (KR); Seung-ok Lim, Gyeonggi-do (KR)

(73) Assignee: Korea Electronics Technology Institute, Seongnam-Si (KR)

( * ) Notice: Subject to any disclaimer, the term of this patent is extended or adjusted under 35 U.S.C. 154(b) by 0 days.

(21) Appl. No.: 12/994,670

(22) PCT Filed: Apr. 8, 2009

(86) PCT No.: PCT/KR2009/001821
§ 371 (c)(1),
(2), (4) Date: Feb. 25, 2011

(87) PCT Pub. No.: WO2009/145505
PCT Pub. Date: Dec. 3, 2009

(65) Prior Publication Data
US 2011/0133831 A1  Jun. 9, 2011

(30) Foreign Application Priority Data
May 30, 2008  (KR) ...................... 10-2008-00050786

(51) Int. Cl.
H03D 1/02 (2006.01)
H03K 9/00 (2006.01)
H04L 27/06 (2006.01)

(52) U.S. Cl. ........ 329/358; 329/311; 329/361; 329/363; 375/340

(58) Field of Classification Search .................. 329/311, 329/347, 358, 361–366, 304; 375/286–294, 375/324, 340, 349; 455/337
See application file for complete search history.

(56) References Cited

U.S. PATENT DOCUMENTS

| 5,166,953 A | * | 11/1992 | Hershey et al. | ................ 375/133 |
| 5,754,601 A |   | 5/1998  | Horng et al.   |                         |
| 5,872,776 A | * | 2/1999  | Yang           | .............................. 370/342 |
| 5,949,827 A | * | 9/1999  | DeLuca et al.  | ................. 375/324 |

(Continued)

FOREIGN PATENT DOCUMENTS

KR  10-1993-0001735  1/1993
(Continued)

OTHER PUBLICATIONS

Written Opinion of the International Searching Authority, PCT/KR2009/001821, 3 pages, Nov. 20, 2009.
(Continued)

Primary Examiner — Levi Gannon
(74) Attorney, Agent, or Firm — Sughrue Mion, PLLC

(57) ABSTRACT

The present invention relates to a demodulator for simultaneous multi-node receiving and a method therof; and, more particularly, a demodulator in a wireless communication system for receiving signals from multi nodes simultaneously and a method thereof.

In accordance with the aspect of the present invention, there is provided a demodulator for simultaneous multi-node receiving which comprises: a clock generator for generating a pair of CW signals and a pair of demodulating modules, wherein the demodulating modules comprise a mixer for multiplying received signals and one of the CW signals, an integrator for integrating multiplied signal and data operating unit for calculating variation result of integrated signal at every certain symbol duration and deciding output data in accordance with the variation result.

20 Claims, 6 Drawing Sheets

U.S. PATENT DOCUMENTS

| | | | |
|---|---|---|---|
| 6,362,738 B1 | 3/2002 | Vega | |
| 6,542,483 B1 * | 4/2003 | Dinc et al. | 370/332 |
| 7,907,680 B2 * | 3/2011 | Tsai et al. | 375/316 |
| 2002/0044593 A1 * | 4/2002 | Kuo | 375/148 |
| 2005/0069059 A1 * | 3/2005 | Krivokapic | 375/340 |
| 2007/0063895 A1 | 3/2007 | August et al. | |
| 2007/0069864 A1 | 3/2007 | Bae et al. | |
| 2012/0002761 A1 * | 1/2012 | Won et al. | 375/340 |

FOREIGN PATENT DOCUMENTS

| | | |
|---|---|---|
| KR | 10-2002-0031667 | 5/2002 |
| KR | 10-2007-0036624 | 4/2007 |
| WO | 2006/088806 | 8/2006 |

OTHER PUBLICATIONS

International Search Report; PCT/KR2009/001821; Nov. 25, 2009.

* cited by examiner

[FIG. 1]     (RELATED ART)
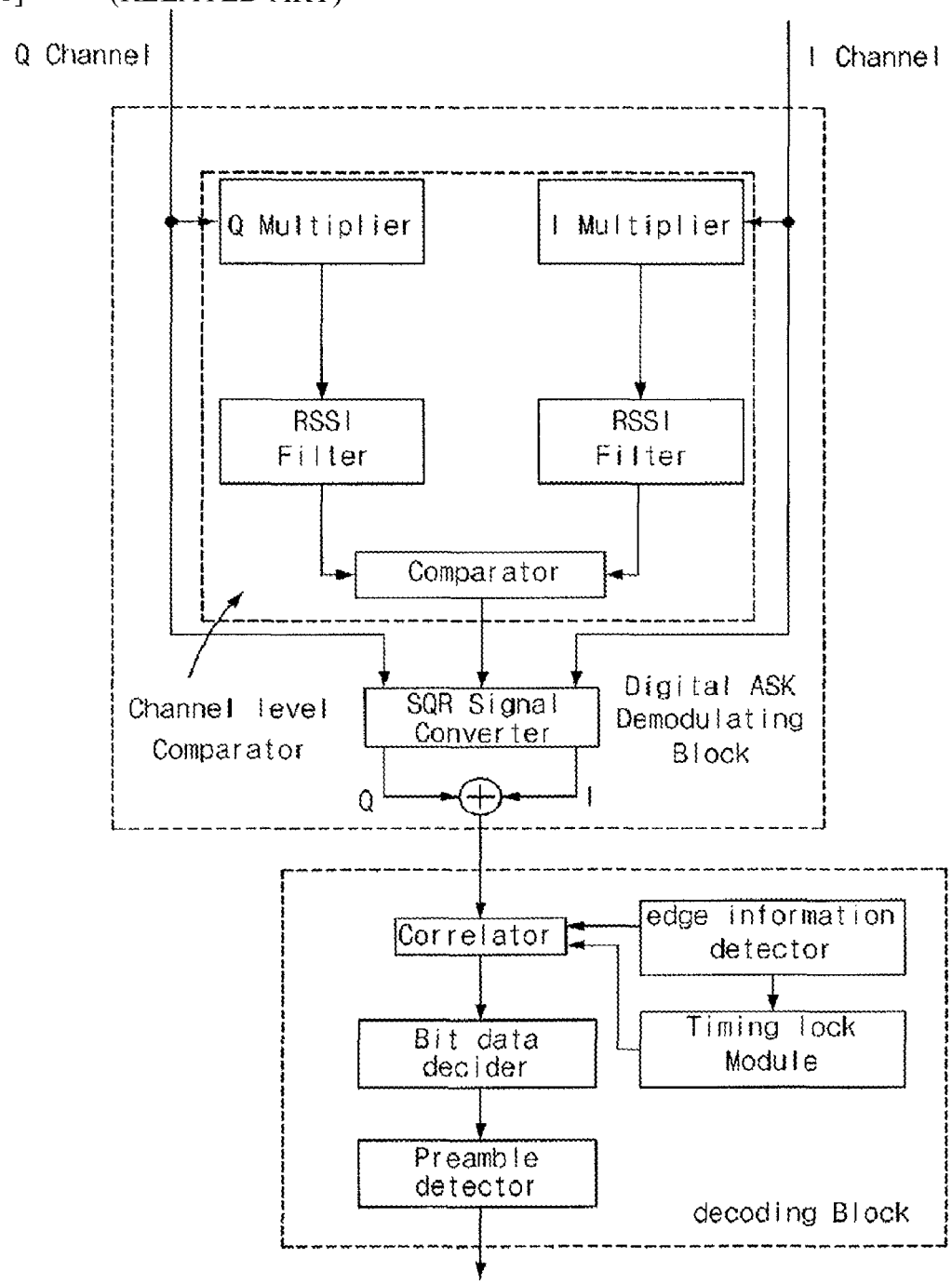

[Fig. 2]
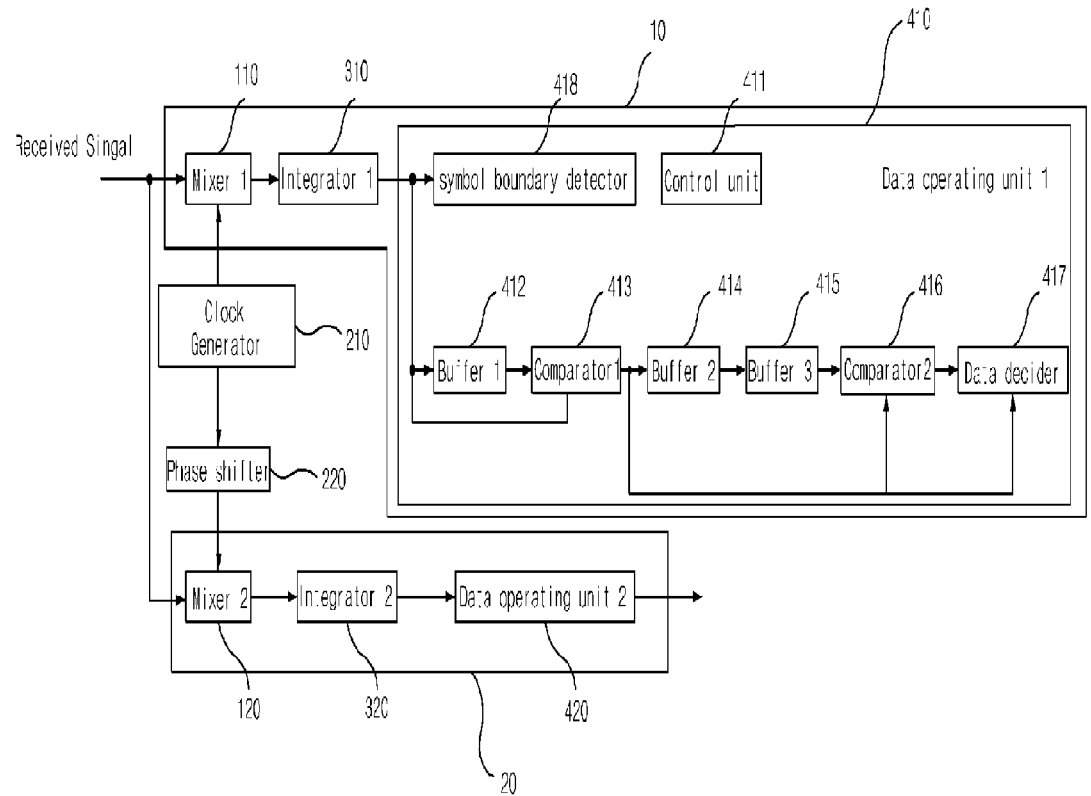
[Fig. 3]
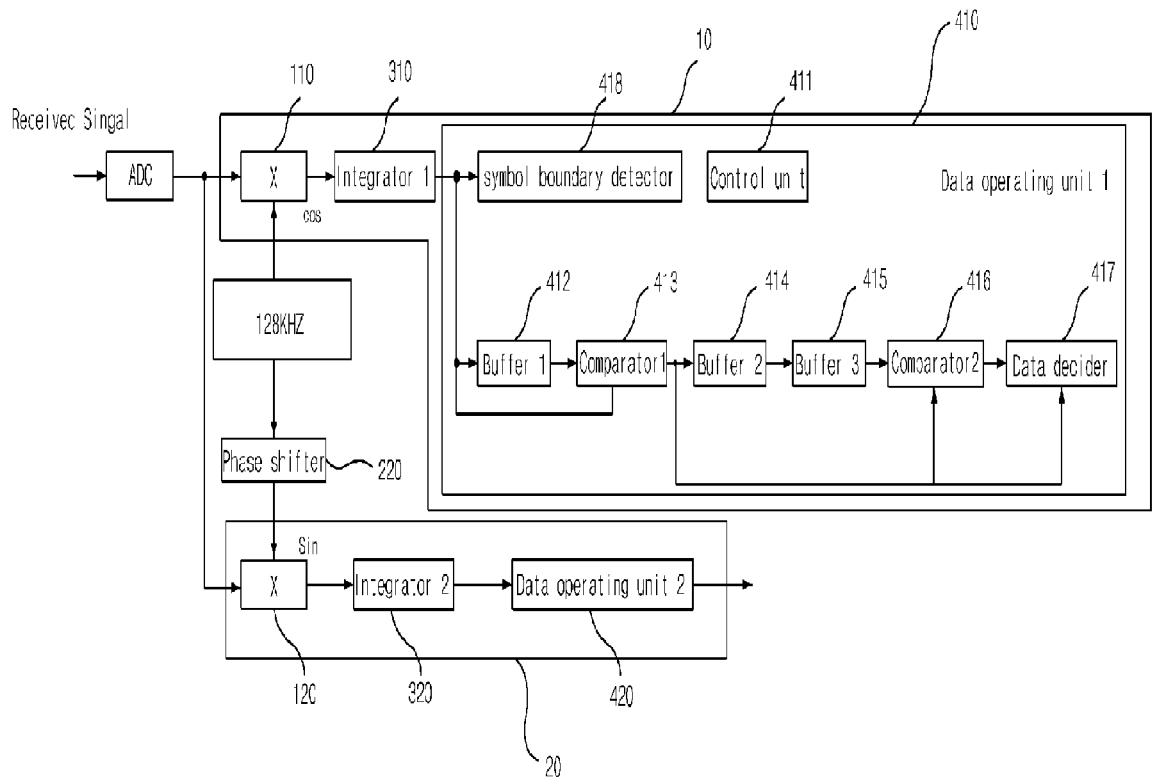

[Fig. 4]
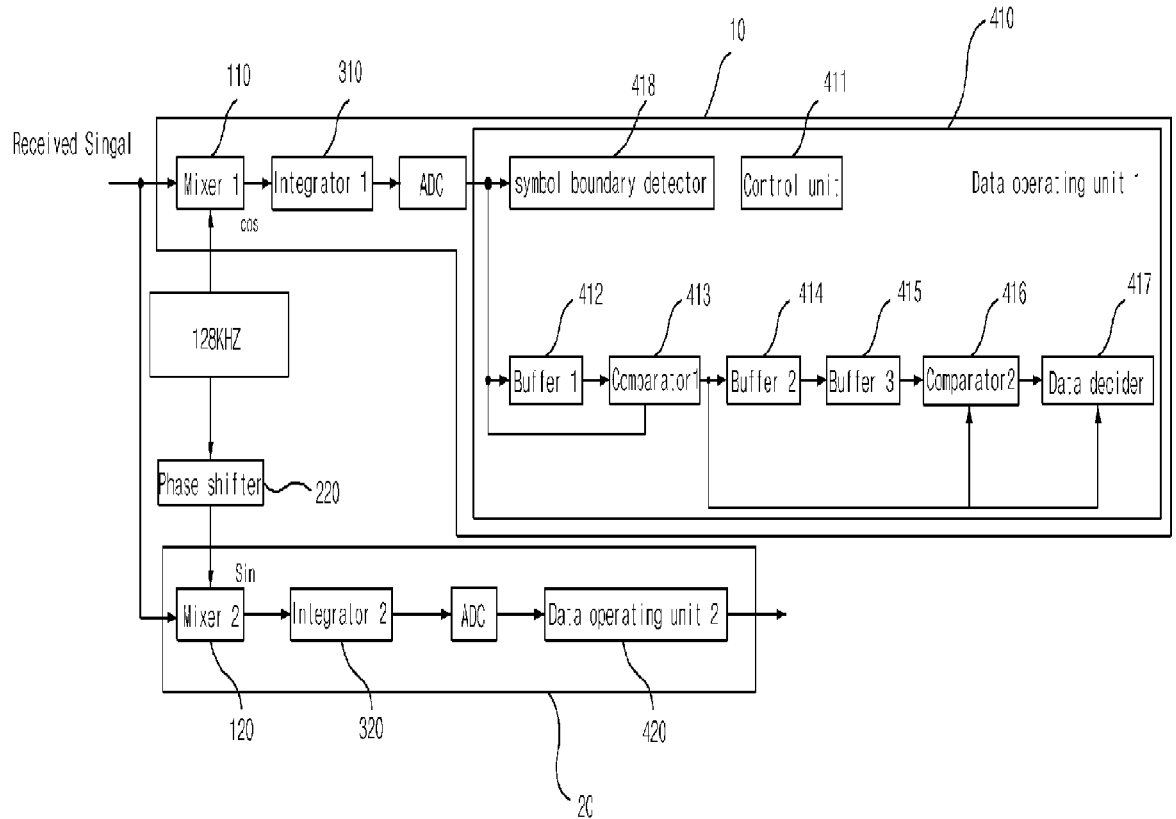
[Fig. 5]
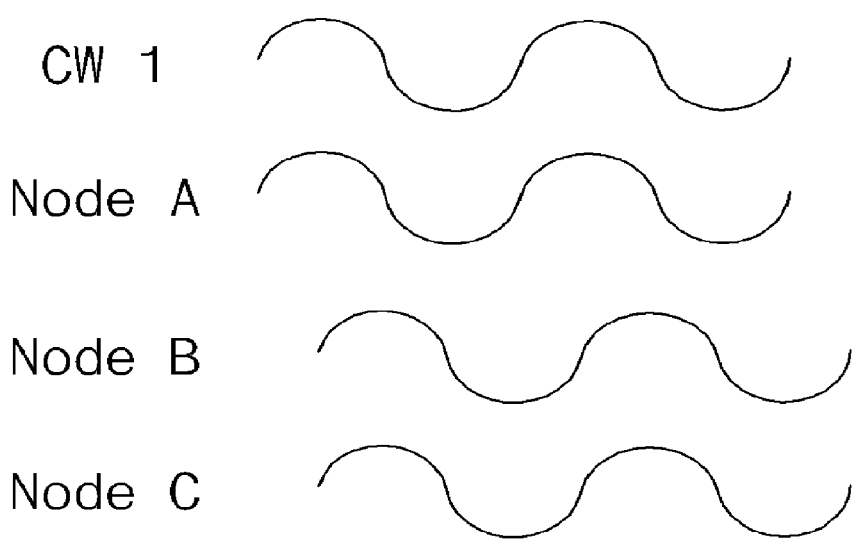

[Fig. 6]
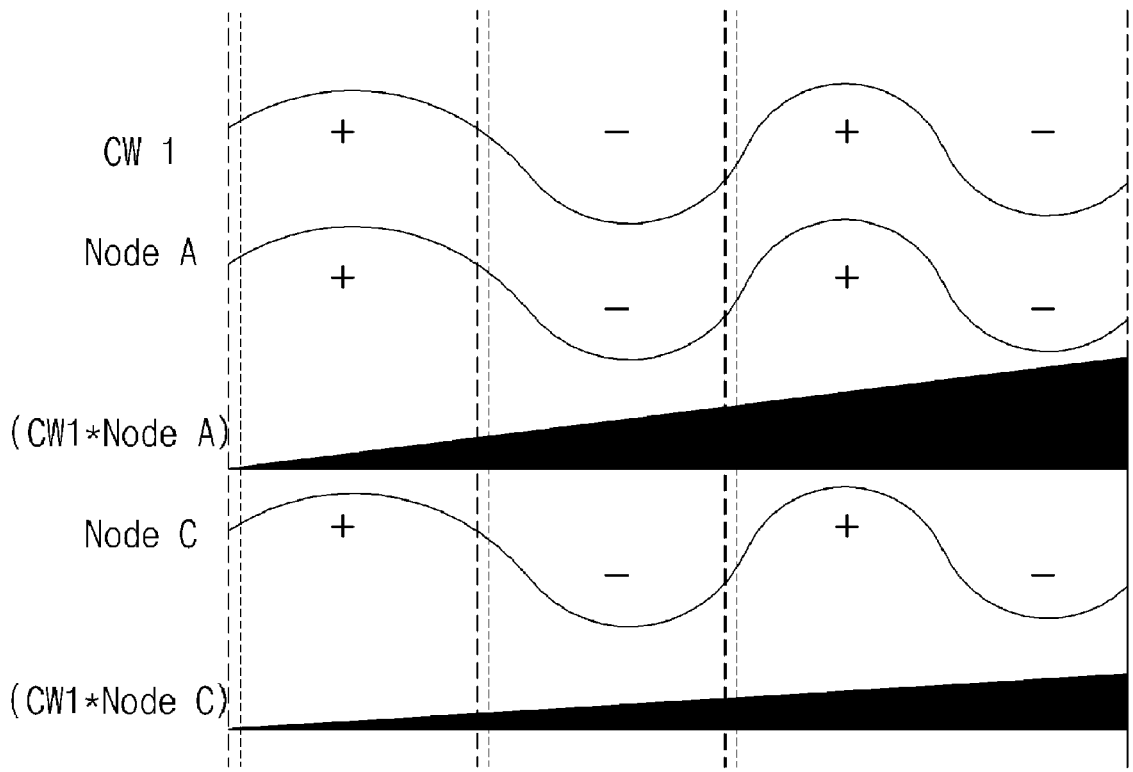
[Fig. 7]
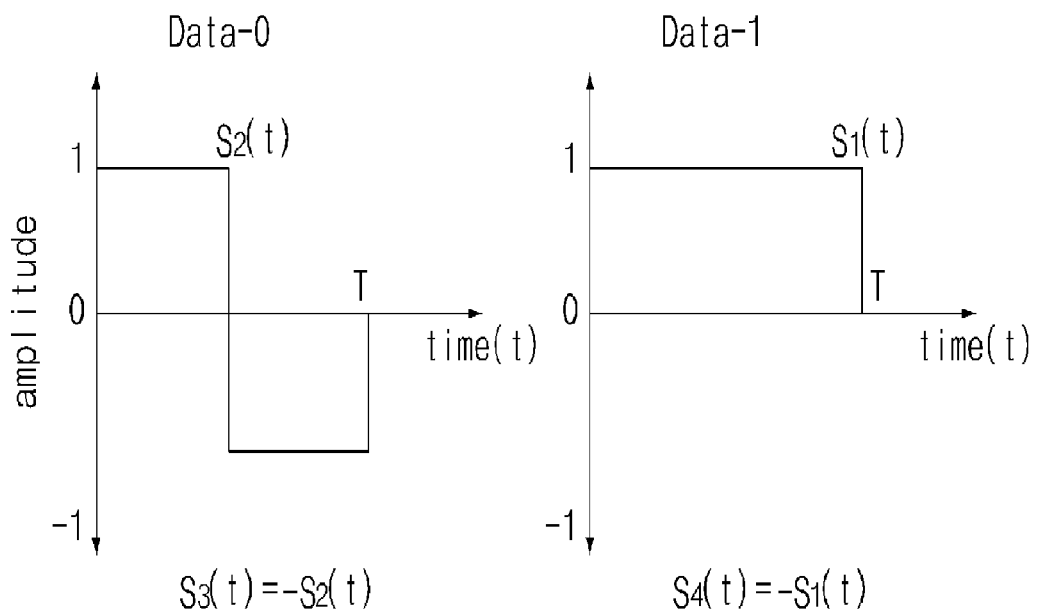

[Fig. 8]
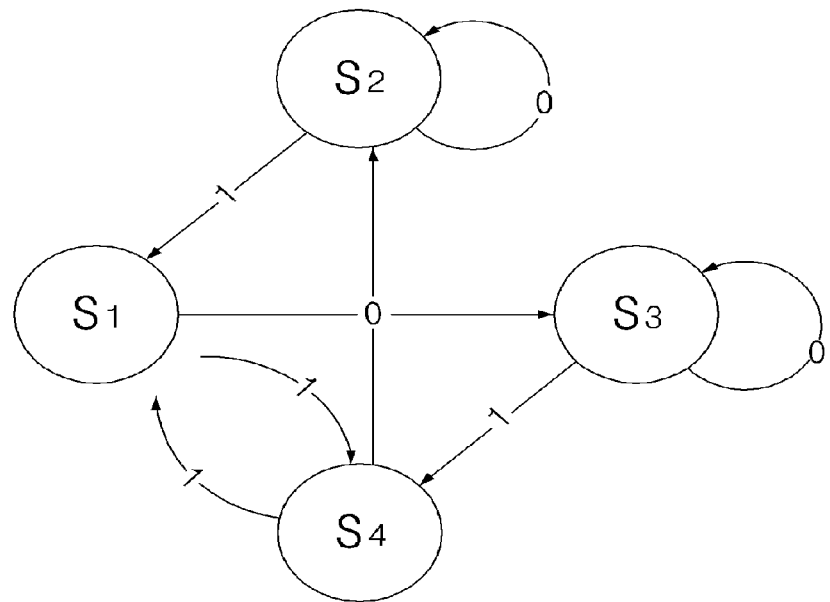
[Fig. 9]
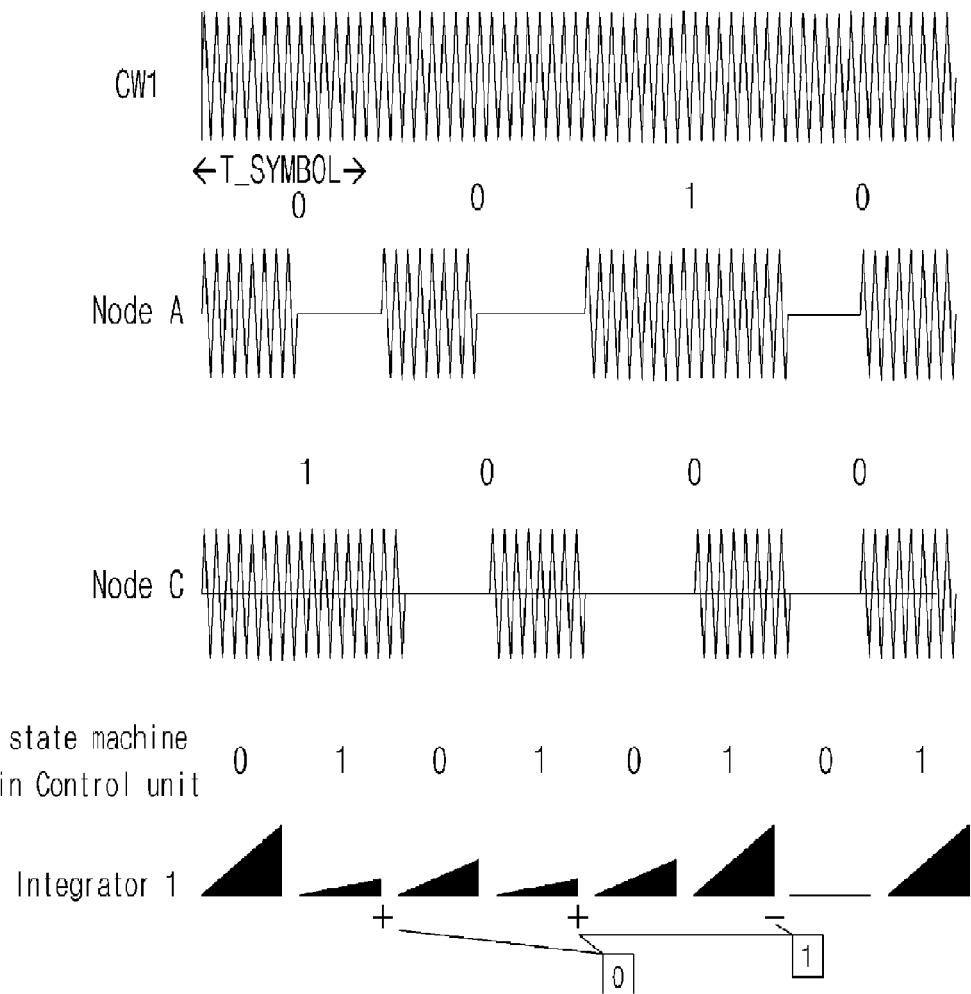

[Fig. 10]
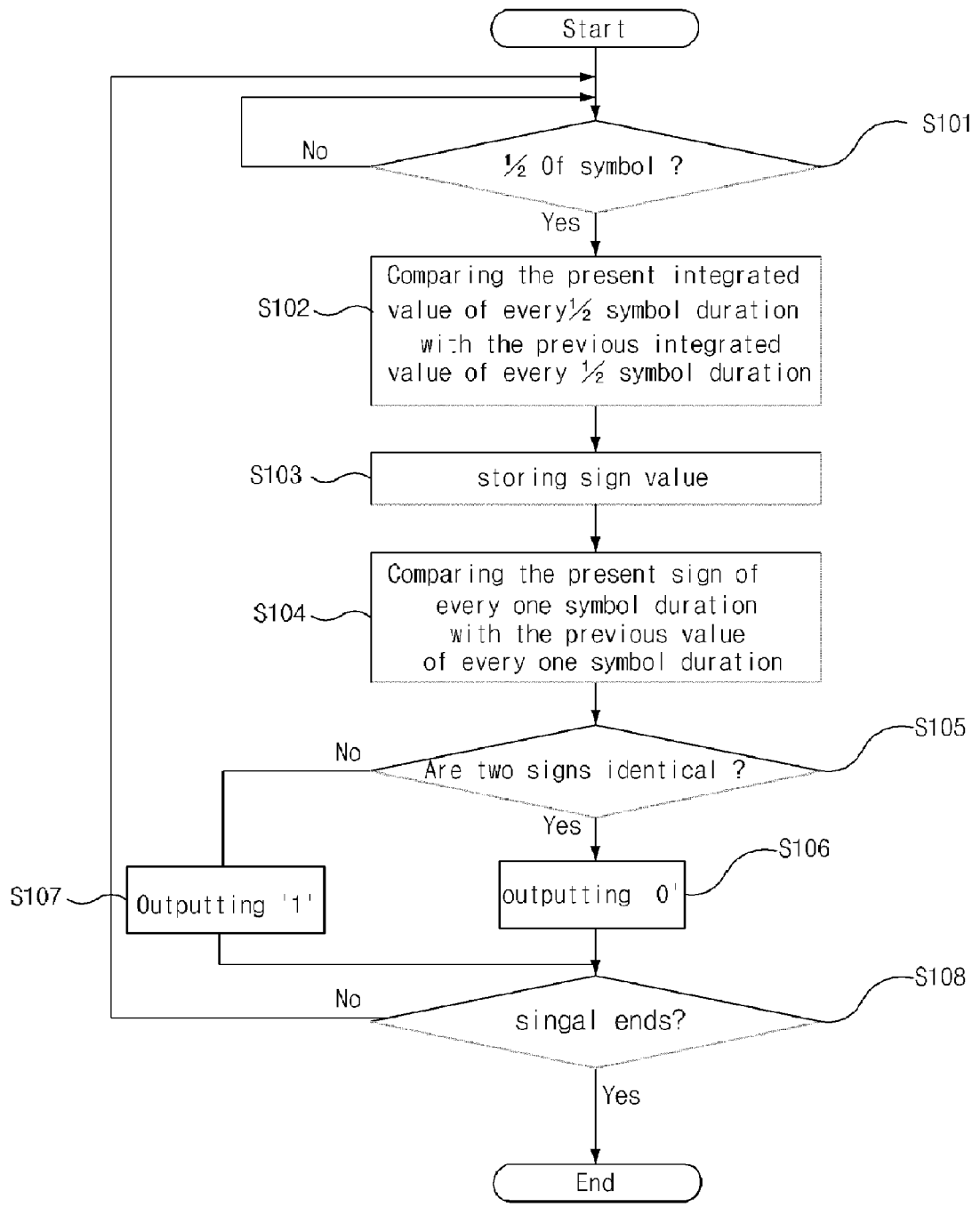

DEMODULATOR FOR SIMULTANEOUS MULTI-NODE RECEIVING AND THE METHOD THEREOF

TECHNICAL FIELD

The present invention relates to a demodulator for simultaneous multi-node receiving and a method therof; and, more particularly, a demodulator in a wireless communication system for receiving signals from multi nodes simultaneously and a method thereof.

BACKGROUND ART

FIG. 1 is a block diagram describing a node signal receiving device in a RF system in prior art. As shown in FIG. 1, the node signal receiving device in a RF system comprises a digital demodulating block for performing ASK demodulation through SQR(Square Root) signal conversion that squares negative data of I channel node signal and Q channel node signal and transforms squared data to negative data and a decoding block for detecting edge position information by using the integration of demodulated signal and decoding said demodulated signal by using detected edge position information. Meanwhile, the digital demodulating block comprises a phase shifter for shifting phase of the node signal whose signal level is lower than the other between the node signals of I channel and Q channel outputted from ADC (Analog to Digital Converter), a signal converter for performing SQR signal conversion onto phase-shifted node signal and the node signal which has higher signal level, and a adder for adding converted node signal of I channel and converted node signal of Q channel.

Furthermore, the decoding block comprises an edge information detector for detecting edge position information of a demodulated signal, a correlator for performing signal correlation onto the demodulated signal by using detected edge position information and a bit data decider for deciding bit data by using signal correlation result.

DISCLOSURE OF INVENTION

Technical Problem

The node signal receiving device in a RF system of prior art inverts the phase of the node signal whose signal level is lower than the other between the node signals of I channel and Q channel, performs SQR signal conversion onto phase-inverted signal and the node signal which has higher signal level, adding converted node signal of I channel and converted node signal of Q channel and transmits added signals to decoding block. Through the above process the node signal receiving device receives signals from nodes.

When many nodes send signals simultaneously, however, some node signals have a higher signal level in I channel and the others have a higher signal level in Q channel because every node has a different phase.

It is, therefore, the node signal receiving method in the prior art has a technical problem that RF system should repeat the protocol defined in the system until only one node respond to the RF system.

Technical Solution

In accordance with the aspect of the present invention, there is provided a demodulator for simultaneous multi-node receiving, which comprises: a clock generator for generating a pair of CW signals and a pair of demodulating modules, wherein the demodulating modules comprise a mixer for multiplying received signals and one of the CW signals, an integrator for integrating multiplied signal and data operating unit for calculating variation result of integrated signal at every certain symbol duration and deciding output data in accordance with the variation result.

In accordance with another aspect of the present invention, there is provided a method for simultaneous multi-node receiving comprises the steps of: a) mixing a CW signal and received signals, b) integrating mixed signal and c) storing integrated signal value and deciding data according to the calculation of variation result of the integrated signal value at every certain symbol duration.

Advantageous Effects

According to the present invention, a signal receiving time of entire nodes could be reduced because simultaneous receiving of multi-nodes signals is available via distinguishing node signals even when more than two nodes respond to the demodulator simultaneously. Furthermore, as more than one data from different nodes can be demodulated simultaneously, data modulating speed can be increased.

BRIEF DESCRIPTION OF DRAWINGS

The above and other objects and features of the present invention will become apparent from the following description of the preferred embodiments given in conjunction with the accompanying drawings, in which:

FIG. 1 is a block diagram showing a node signal receiving device of a RFID reader in prior art;

FIG. 2 is a block diagram showing a demodulator for simultaneous multi-node receiving in accordance with the present invention;

FIG. 3 is a block diagram showing a demodulator for simultaneous multi-node receiving in accordance with the first embodiment of the present invention;

FIG. 4 is a block diagram showing a demodulator for simultaneous multi-node receiving in accordance with the second embodiment of the present invention;

FIG. 5 is a graph showing carrier wave of response signals when node A, node B, and node C respond simultaneously;

FIG. 6 is a graph showing integrated value of Integrator 1 that received signal $I_1$;

FIG. 7 is a graph showing eigen functions of FM0 encoding;

FIG. 8 is a state diagram of FM0 encoded signal;

FIG. 9 is a graph showing signals of integrator and state machine in accordance with an embodiment of the present invention; and FIG. 10 is a flow chart describing a method for simultaneous multi-node receiving in accordance with the present invention.

BEST MODE FOR CARRYING OUT THE INVENTION

Hereinafter, the best mode of embodiments of the present invention will be described in detail with reference to the attached drawings.

FIG. 2 is a block diagram showing a demodulator for simultaneous multi-node receiving in accordance with the present invention.

As shown in FIG. 2, the demodulator for simultaneous multi-node receiving in accordance with the present invention comprises: a clock generator 210, a phase shifter 220, and a pair of demodulating modules 10, 20 comprising a mixer 110, 120, an integrator 310, 320 and a data operating unit 410, 420.

Clock generator 210 generates a pair of CW signals. the pair of CW signals has same frequency with received signals.

Phase shifter 220 shifts the phase of one of the CW signals by 90°

Mixers 110, 120 mix one of the CW signals with the received signals(e.g. ASK signal) which are transmitted from nodes and output mixed signal. Meanwhile, there is 90° phase difference between the pair of CW signals that are inputted into mixer-1 110 and mixer-2 120. That is, CW-1 signal which is generated in clock generator 210 is inputted directly into mixer-1 110 and CW-2 signal which is generated in clock generator 210 and shifted its phase by 90° along phase shifter 220 is inputted into mixer-2 120. The bit data of the received signals inputted in mixer 110, 120 is encoded in one of encoding method such as FM0, Miller, and Manchester coding.

Integrators 310, 320 integrate mixed signals. Integrated values integrated from the integrators are affected most by the received signals which have the least difference in phase with inputted reference signal, inputted CW signal. Integrations of integrators 310, 320 are performed at every half data symbol duration(½ symbol duration).

Data operating unit 410 stores the integrated values that are integrated from integrators 310, 320, and deciding output data according to the variation result of the intergrated signal value at every certain symbol duration. Data operating unit 410 comprises control unit 411, symbol boundary detector 418, buffer-1 412, comparator-1 413, buffer-2 414, buffer-3 415, comparator-2 416 and data decider 417.

Symbol boundary detector 418 detects a half of a data symbol duration.

Integrator 310 stores integrated values in buffer-1 412 at every ½ symbol duration, buffers 412, 414, 415 store data at every ½ symbol duration.

Comparator-1 413 compares the present integrated value of integrator 310 with the previous integrated value stored in buffer-1 412, decides a sign—a plus or a minus—according to the result of comparison of integrated values, and outputs the sign at every ½ symbol duration.

Comparator-2 416 compares the present sign of comparator-1 413 with the previous sign of comparator-1 stored in buffer-3 415 (that is, sign of comparator-1 outputted 1 symbol duration before) at every 1 symbol duration.

Control unit 411 controls operations of integrator 310, comparators 414, 415, and buffers 413, 415, 416 at every ½ data symbol duration which is detected by symbol boundary detector 418. Furthermore, control unit 411 comprises state machine (not illustrated) that decides data comparison time of comparator-1 413 and comparator-2 416.

Data decider 417 decides data according to either the result of comparator-1 413 or the result of comparator-2 416. Data decider 417 also decides either the result of comprator-1 or the result of comparator-2 on the basis of the encoding methods of the received signals. In case bit data of received signals are encoded in FM0, data decider 417 outputs '0' when two signs, the present sign of comparator-1 and the previous sign of comparator-1 outputted 1 symbol duration before, are identical according to comparison result of comparator-2, outputs '1' when two signs are different.

In case, bit data of received signals are encoded in Miller code, data decider 417 outputs '1' when two signs, the present sign of comparator-1 and the previous sign of comparator-1 outputted 1 symbol duration before, are identical according to comparison result of comparator-2 while data decider 417 outputs '0' when the said two signs are different.

In case, bit data of received signals are encoded in Manchester code, data decider 417 may outputs '1' when the present sign of comparator-1 is '+', outputs '0' when the present sign of comparator-1 is '−'. On the other hand, data decider 417 may outputs '1' when the present sign of comparator-1 is '−', outputs '0' when the present sign of comparator-1 is '+'.

FIG. 3 and FIG. 4 are block diagrams showing demodulators for simultaneous multi-node receiving in accordance with the embodiments of the present invention. The demodulators in FIG. 3 and FIG. 4 further comprise Analog to Digtal Converters(ADC).

Hereinafter, a demodulator for simultaneous multi-node receiving in accordance with the embodiment of the present invention will be disclosed in detail with reference to the attached drawings, FIG. 5 to FIG. 9.

FIG. 5 is a graph showing carrier wave of response signals when node A, node B and node C respond simultaneously. The response signals of node A, B and C are encoded in FM0 and modulated in ASK modulation method.

As shown in FIG. 5, carrier signal of node A(Node A) has the same phase with CW-1 signal generated in clock generator 210, carrier signal of node B(Node B) has the same phase with CW-2 signal shifted its phase by 90° along phase shifter 220, and carrier signal of node C(Node C) has less phase difference with CW-1 compared with CW-2. Furthermore, the amplitudes of carrier signals of three nodes are identical. According to the above assumptions, signal $I_1$ inputted integrator-1 310 is described in Math Formula 1 and signal $I_2$ inputted integrator-2 320 is described in Math Formula 2.

$$I_1 = (NodeA + NodeC) \times CW1 \qquad \text{[Math Formula 1]}$$

$$I_2 = (NodeB + NodeC) \times CW2 \qquad \text{[Math Formula 2]}$$

FIG. 5 is a graph showing integrated value of Integrator 1 received signal $I_1$.

As shown in FIG. 5, because the phase difference between the carrier signal of node C(Node C) and the CW-1 signal is bigger than the phase difference between the carrier signal of node A(Node A) and the CW-1 signal, the integrated value of (Node C * CW-1) signal is less than that of (Node A * CW-1) signal.

FIG. 7 is a graph showing eigen functions of FM0 encoding and FIG. 8 is a state diagram of FM0 encoded signal.

As shown in FIG. 7, a signal level of FM0 encoded signal is changed at the starting point of every symbol. If data is '0', signal level is further changed at midpoint of every symbol.

Because FM0 encoded signal has features mentioned above, the demodulator of the present invention compares variation result of the integrated values at every ½ symbol duration. Because the demodulator in prior art distinguishes signals by the variation of symbol level, it is not able to detect the exact data if multi nodes respond simultaneously. To overcome the above problem, the demodulator of the present invention compares the variation result of integrated value at every ½ symbol duration.

FIG. 9 is a graph showing signals of integrator and state machine in accordance with the embodiment of the present invention.

To describe the mechanism of state machine, we assume that node A transmits data '0 0 1 0' and node C transmits data '1 0 0 0'. Furthermore, we assume that 100% ASK modulation and N_Carrier(Number of carriers per symbol) =16. We clarify that the present invention is not limited to above ASK modulation index nor N_Carrier number.

As shown in FIG. 9, after signals of node A and node C are inputted, the state machine(not illustrated) comprised in control unit 411 circulates its value with 1 symbol duration.

If the value of state machine is '0', comparator-1 413 compares the present integrated value of integrator-1 310 with the previous integrated value stored in buffer-1 412, and stores comparison result as a sign. Because the present integrated value of the first symbol is higher, '+' sign is stored in buffer-2 414.

Then, comparator-1 413 compares the present integrated value of integrator-1 310 with the previous integrated value stored in buffer-1 412 when the value of the state machine becomes '0' again. According to a comparison result, '+' sign is stored in buffer-2 414. The sign stored in buffer-2 414 is transmitted to buffer-3 415 whenever the value of the state machine is changed, that is, at every ½ symbol duration.

Comparator-2 416 compares the present sign of comparator-1 414 with the previous sign of comparator-1 414 stored in buffer-3 415 at present.

According to comparison result, data decider 417 decodes received data as '0' because two signs are identical.

When the value of the state machine becomes '0' again after repeating the above steps, comparator-2 416 compares two signs again, and data decider 417 decodes received data as '1' because two signs are different(the present sign of comparator-1 is '−' and the 1 symbol previous sign of comparator-1 is '+').

Data operating unit-1 410 decodes the signal of node A through repeating the above steps.

As described above, the demodulator of the present invention is able to distinguish the signal which has the biggest integrated value and decode the signal through comparing variation of integrated value at boundaries of symbols when many signals are received because many nodes responded simultaneously.

Similarly, the signal of node B is decoded by integrator-2 320 and data operating unit-2 420. It is, therefore, the demodulator of the present invention is able to distinguish simultaneously received signals and decode the signals.

FIG. 10 is a flow chart describing a method for simultaneous multi-node receiving in accordance with the present invention.

As shown in FIG. 10, a method for simultaneous multi-node receiving in accordance with an embodiment of the present invention comprises steps of mixing, integrating and data operating.

Mixer 110 receives a CW signal and received signals and mixes two signals.

Integrator 310 integrates mixed signals mixed in mixer 110.

Comparator-1 414 compares the present integrated value with the previous integrated value(S102), and decides a sign and stores the sign(S103) at every ½ symbol duration.

Comparator-2 416 compares the present sign of Comparator-1 with the 1 symbol previous sign of comparator-1 at every 1 symbol duration(S104).

According to the comparison result of comparator-2 416, data decider 417 decides and outputs data as '0' if the two signs of comparator-2 are identical(S106). On the other hand, if the two signs of comparator-2 are not identical, data decider 417 decides and outputs data as '1'(S107).

The above steps are performed until the received signal ends at every ½ symbol duration detected by symbol boundary detector 418(S 108).

Furthermore, the method in accordance with the present invention further comprises steps of comparing the present integrated value with the previous integrated value at every certain symbol duration, and deciding output data according to the comparison result of the above comparing step. The comparing and deciding steps are performed at every ½ symbol duration detected in symbol boundary detection step.

While the present invention has been described with respect to certain preferred embodiments, it will be apparent to those skilled in the art that various changes and modifications may be made without departing from the scope of the invention as defined in the following claims.

For instance, the demodulator of the present invention may comprise 4 demodulating module and 2 more phase shifters (one for shifting 180 degrees and the other for shifting 270 degrees).

Furthermore, a multiplexer(mux) may be added to data operating units 410, 420. The first input of the multiplexer is the output of comparator-1 413 and the second input of the multiplexer is the output of comparator-2 416. The multiplexer outputs either the first input or the second input to data decider 417 according to the encoding method of the received signals.

The invention claimed is:

1. A demodulation apparatus of a wireless communication system demodulating a received signal, the apparatus comprising:
    a clock generator that generates at least two continuous wave (CW) signals; and
    at least two demodulating modules,
    wherein each of the demodulating modules comprises:
        a mixer that mixes the received signal and one of the CW signals, to output a mixed signal;
        an integrator that integrates the mixed signal to output an integrated signal; and
        a data operating unit that calculates variation of the integrated signal, and decides output data in accordance with the variation of the integrated signal at every certain symbol duration,
    wherein the data operating unit comprises:
        a comparator that compares a present value of the integrator with a previous value of the integrator at the every certain symbol duration; and
        a data decider that decides the output data according to a result of the comparison by the comparator.

2. The apparatus of claim 1, wherein the CW signals are a pair of CW signals that are different in phase by 90 degrees and have identical frequencies in comparison with the received signal, and
    wherein the received signal is encoded using one of encoding methods of Miller coding, FMO coding, and Manchester coding.

3. The apparatus of claim 2, wherein the data operating unit further comprises:
    a symbol boundary detector that detects a given point in every one symbol duration;
    a control unit that controls the comparison by the comparator and the decision by the data decider to be performed at the given point in every one symbol duration detected by the symbol boundary detector.

4. The apparatus of claim 3, wherein the given point in every one symbol duration is one half (½) symbol duration.

5. The apparatus of claim 4, wherein the comparator comprises:
    a first comparator that compares the present value of the integrator with the previous value of the integrator and decides a sign at the every ½ symbol duration, and
    a second comparator that compares the sign decided by the first comparator with a previous sign decided by the first comparator at every one (1) symbol duration.

6. The apparatus of claim 5, wherein the data decider decides the output data according to a result of the comparison by the second comparator, and
wherein the output data decided by the data decider differs based on which of the encoding methods is used in the encoding of the received signal.

7. The apparatus of claim 6, wherein the data decider decides the output data as '0' if the sign decided by the first comparator and the previous sign of the first comparator are identical according to the result of the comparison by the second comparator, and
wherein the data decider decides the output data as '1' if the sign decided by the first comparator and the previous sign of the first comparator are not identical according to the result of the comparison by the second comparator.

8. The apparatus of claim 7, wherein the control unit comprises a state machine that decides a time of the comparison, by the first comparator, of the present value of the integrator with the previous value of the integrator, and a time of the comparison, by the second comparator, of the sign decided by the first comparator with the previous sign decided by the first comparator.

9. The apparatus of claim 8, wherein the data operating unit comprises a plurality of buffers that store data at the every ½ symbol duration.

10. The apparatus of claim 9, wherein the buffers comprise a buffer between the integrator and the first comparator, and two buffers between the first comparator and the second comparator.

11. A wireless communication system for demodulating a signal, the system comprising:
an apparatus that receives the signal from an antenna, demodulates the received signal, and outputs demodulated data; and
a control unit that operates the demodulated data and controls the antenna and the demodulation apparatus,
wherein the apparatus is the demodulation apparatus of claim 1.

12. The wireless communication system of claim 11, wherein the CW signals are a pair of CW signals that are different in phase by 90 degrees and have identical frequencies in comparison with the received signal.

13. The wireless communication system of claim 12, wherein the received signal is encoded using one of encoding methods of miller coding, FMO coding, and Manchester coding.

14. The wireless communication system of claim 11, wherein the data operating unit of the demodulation apparatus further comprises:
a symbol boundary detector that detects every one half (½) symbol duration:
a control unit that controls the comparison by the comparator and the decision by the data decider to be performed at the every ½ symbol duration detected by the symbol boundary detector, and wherein the comparator comprises:
a first comparator that compares the present value of the integrator with the previous value of the integrator and decides a sign at the every ½ symbol duration, and
a second comparator that compares the sign decided by the first comparator with a previous sign decided by the first comparator at every one symbol duration.

15. A demodulation method of a wireless communication system demodulating a received signal, the method comprising steps of:
a) mixing one of at least two continuous wave (CW) signals and the received signal, to output a mixed signal;
b) integrating the mixed signal to output an integrated signal; and
c) calculating variation of the integrated signal and deciding output data at every certain symbol duration,
wherein the step c comprises:
c1) comparing a present integrated value from the step b with a previous integrated value from the step b at the every certain symbol duration; and
c2) deciding the output data according to a result of the comparison of the step c1.

16. The method of claim 15, wherein the step c further comprises:
c3) detecting a given point in every one symbol duration,
wherein the step c1 and the step c2 are performed at the given point in every one symbol duration.

17. The method of claim 16, wherein the given point in every one symbol duration is one half (½) symbol duration, and
wherein the step c1 comprises
c1-i) comparing the present integrated value with the previous integrated value, and deciding a sign according to a result of the comparison at the every ½ symbol duration, and
c1-ii) comparing the sign decided at the step c2-i with a previous sign decided at the step c2-i at every one (1) symbol duration.

18. The method of claim 17, wherein the step c3 comprises:
deciding the output data as '0' if the two compared signs are identical; and
deciding the output data as '1' if the two compared signs are not identical.

19. The method of claim 17, wherein the step c3 comprises:
deciding the output data as '1' if the two compared signs are identical; and
deciding the output data as '0' if the two compared signs are not identical.

20. The method of claim 15, wherein the received signal is a signal encoded using one of encoding methods of Miller coding, FMO coding and Manchester coding, and
wherein the deciding the output data in step c comprises deciding the output data according to the variation of the integrated signal.

* * * * *